(12) United States Patent
Joo et al.

(10) Patent No.: US 9,159,768 B2
(45) Date of Patent: Oct. 13, 2015

(54) SEMICONDUCTOR DEVICE AND ELECTRONIC DEVICE INCLUDING THE SAME

(71) Applicant: SK HYNIX INC., Icheon (KR)

(72) Inventors: Moon-Sig Joo, Icheon (KR); Woo-Young Park, Icheon (KR)

(73) Assignee: SK Hynix Inc., Icheon (KR)

( * ) Notice: Subject to any disclaimer, the term of this patent is extended or adjusted under 35 U.S.C. 154(b) by 145 days.

(21) Appl. No.: 13/945,521

(22) Filed: Jul. 18, 2013

(65) Prior Publication Data

US 2014/0268995 A1 Sep. 18, 2014

(30) Foreign Application Priority Data

Mar. 12, 2013 (KR) .................. 10-2013-0026045

(51) Int. Cl.
*G11C 13/00* (2006.01)
*H01L 27/24* (2006.01)
*H01L 45/00* (2006.01)

(52) U.S. Cl.
CPC .......... *H01L 27/2409* (2013.01); *H01L 27/249* (2013.01); *H01L 45/06* (2013.01); *H01L 45/08* (2013.01); *H01L 45/085* (2013.01); *H01L 45/1226* (2013.01); *H01L 45/144* (2013.01); *H01L 45/146* (2013.01); *H01L 45/147* (2013.01); *H01L 45/1675* (2013.01)

(58) Field of Classification Search
CPC ..... H01L 45/145; H01L 27/249; H01L 45/06; G11C 13/0004; G11C 2213/71; G11C 13/0007; G11C 13/0011
USPC .......................................... 365/148; 257/4, 5
See application file for complete search history.

(56) References Cited

U.S. PATENT DOCUMENTS

| 8,173,987 | B2 | 5/2012 | Lung | |
|---|---|---|---|---|
| 2011/0115049 | A1* | 5/2011 | Kim et al. | 257/530 |
| 2014/0029330 | A1* | 1/2014 | Muraoka et al. | 365/148 |

FOREIGN PATENT DOCUMENTS

KR 10-1133392 B1 4/2012

* cited by examiner

*Primary Examiner* — Han Yang
*Assistant Examiner* — Xiaochun L Chen

(57) ABSTRACT

A semiconductor device includes: a vertical electrode provided over a substrate; a variable resistance layer provided at least a sidewall of the vertical electrode; a plurality of horizontal electrodes extending from the sidewall of the vertical electrode and having the variable resistance layer interposed; a transition metal oxide layer provided (i) between the vertical electrode and the variable resistance layer or (ii) between the plurality of horizontal electrodes and the variable resistance layer; and a threshold voltage switching layer provided in the transition metal oxide layer and selectively between the vertical electrode and the any of the plurality of horizontal electrodes.

18 Claims, 13 Drawing Sheets

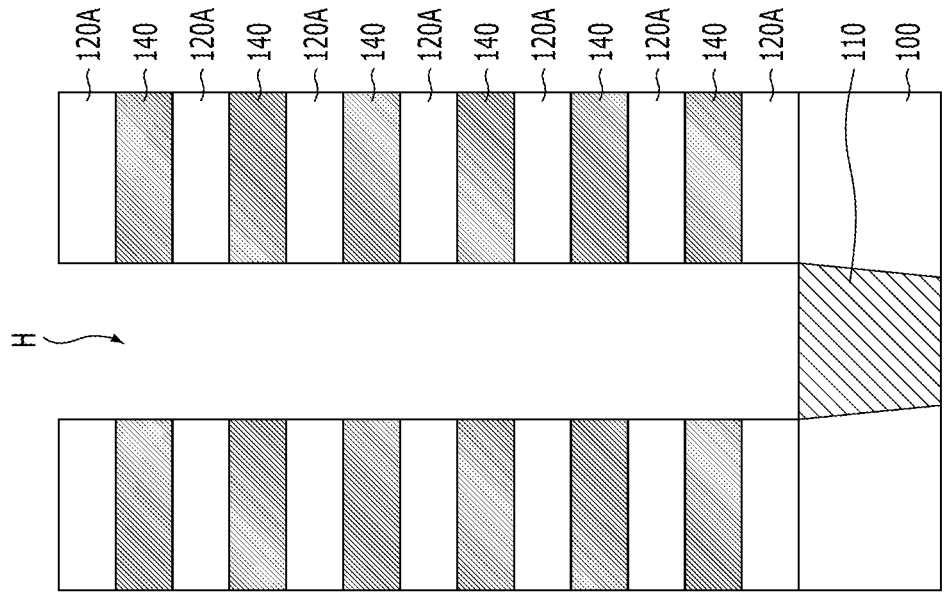
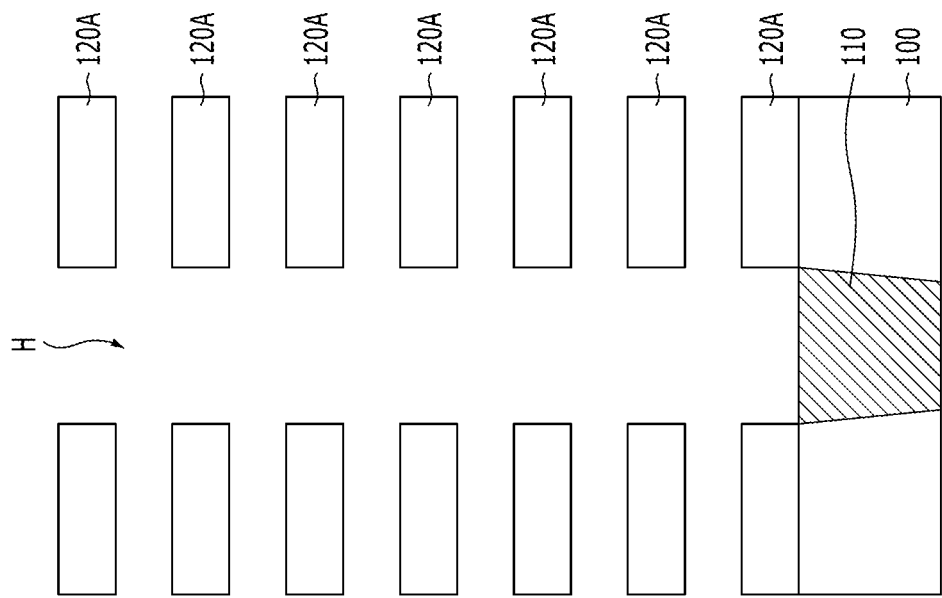

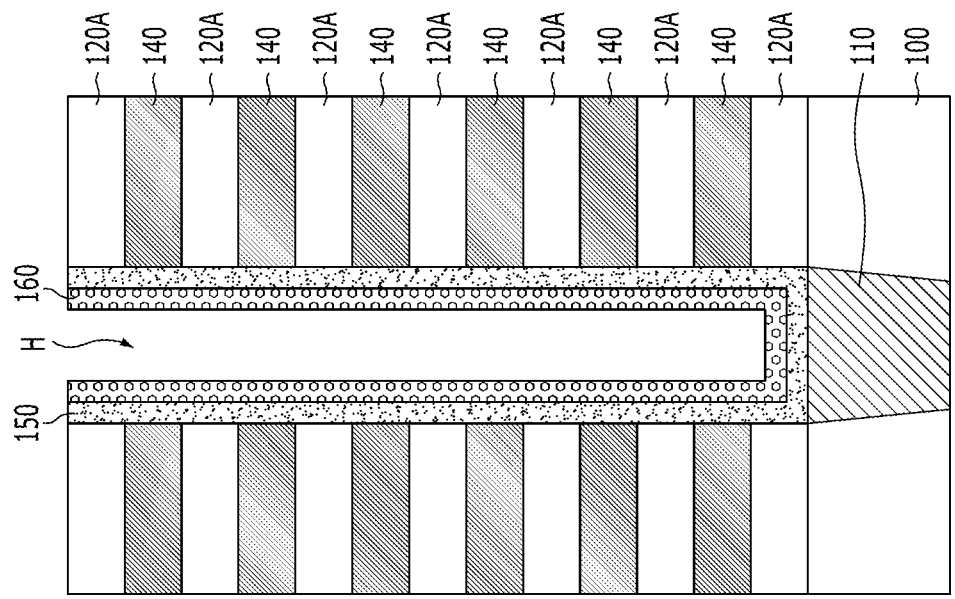
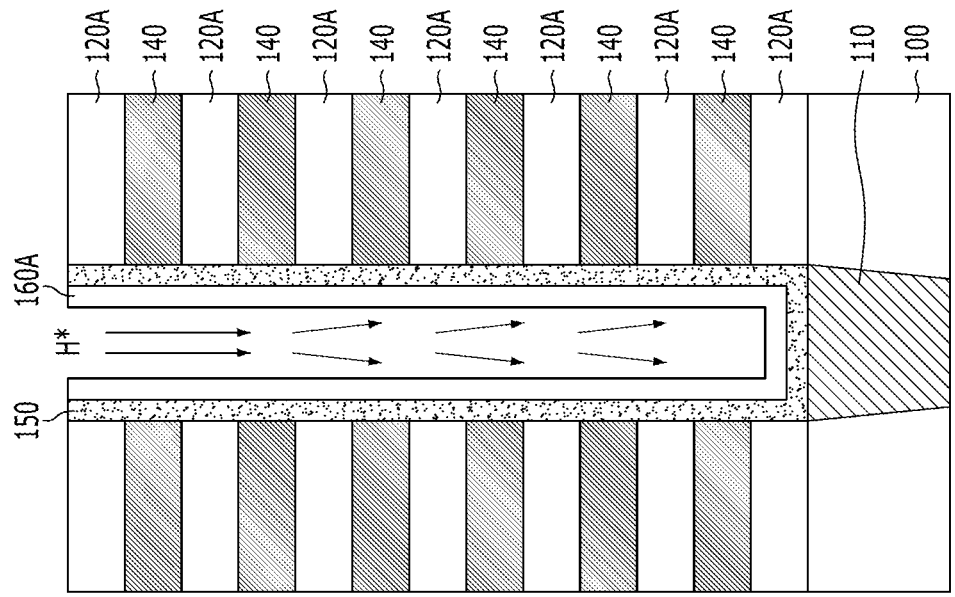

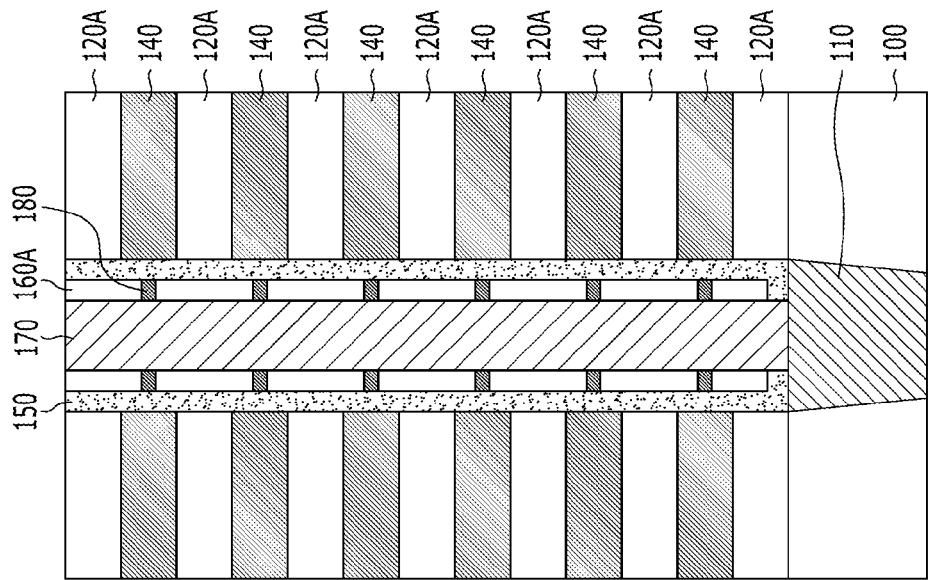
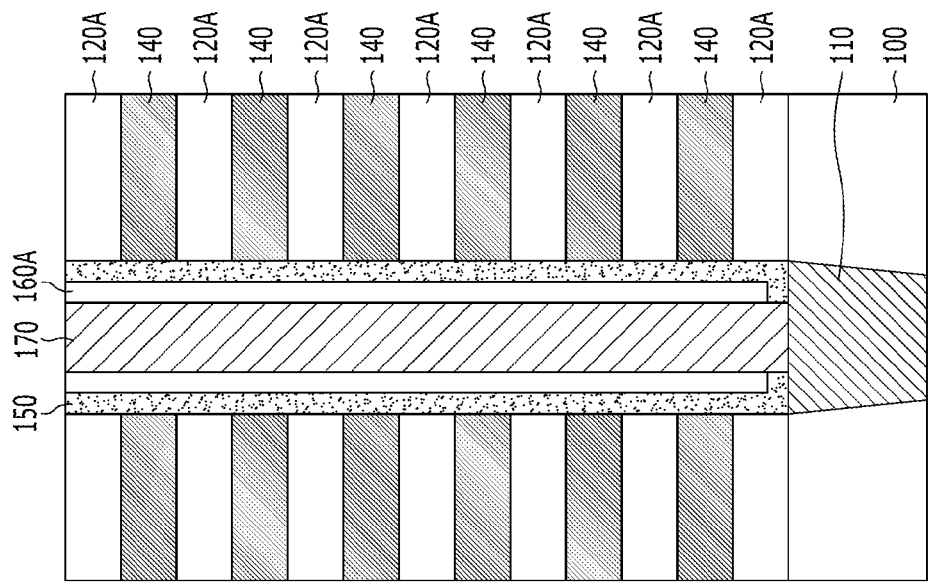

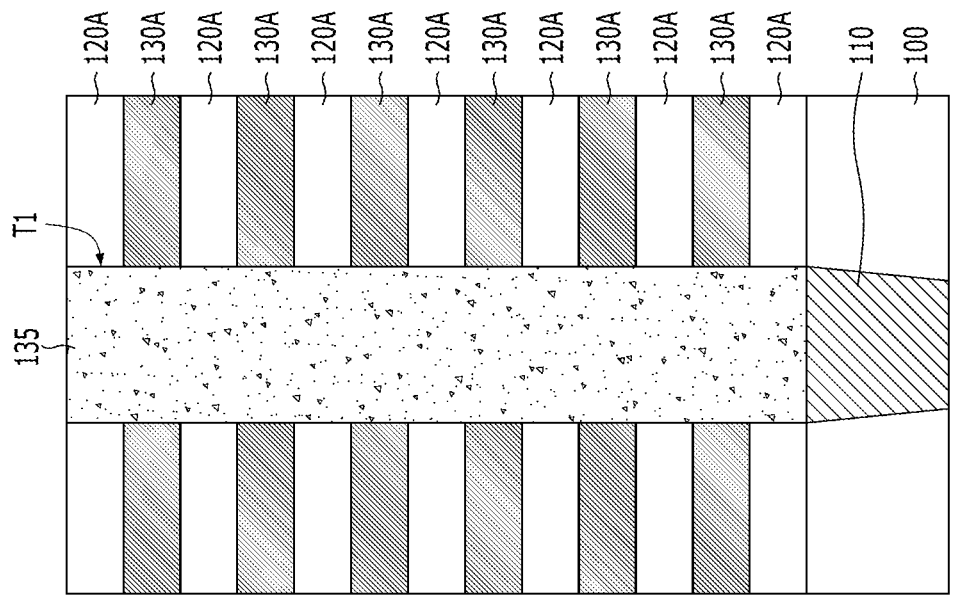
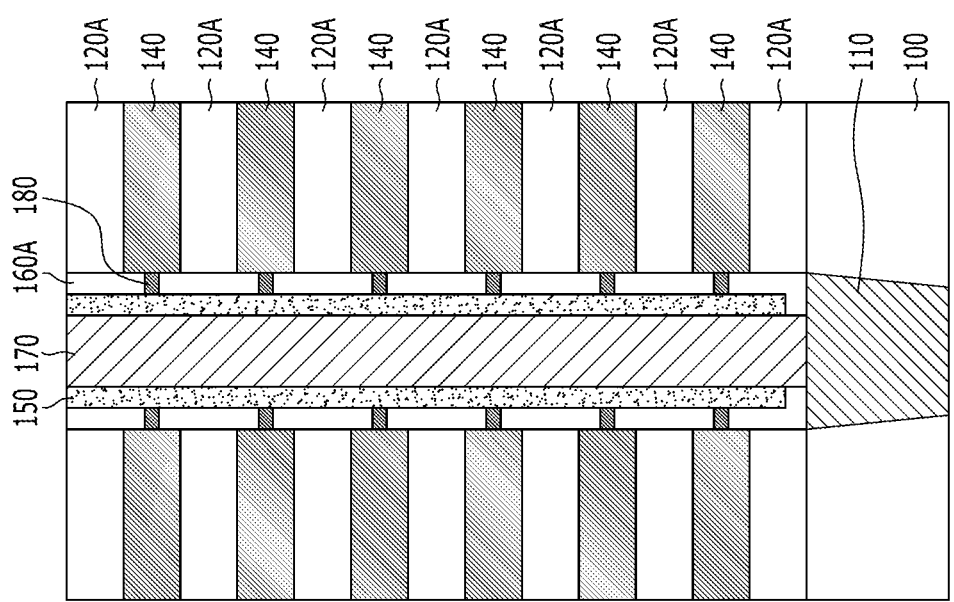

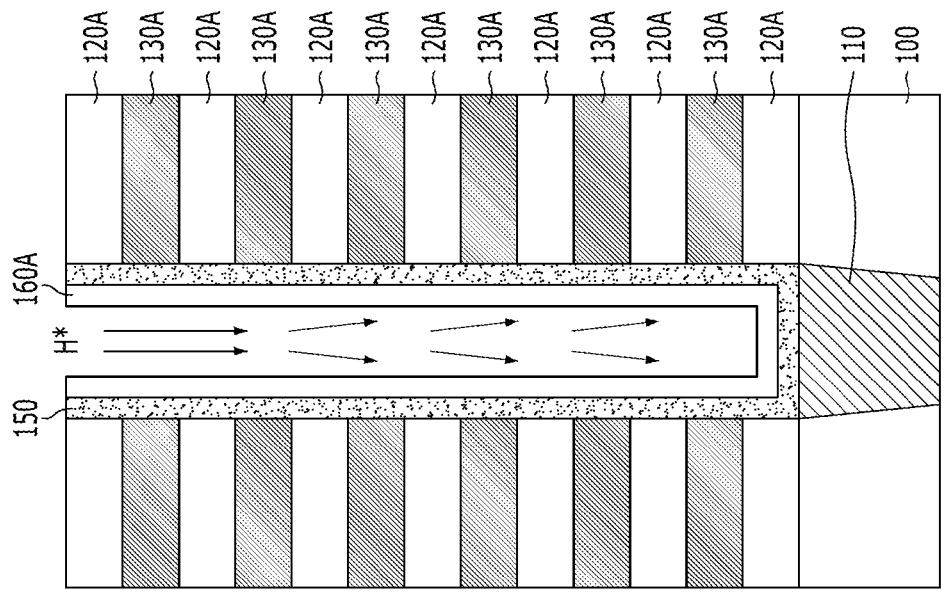
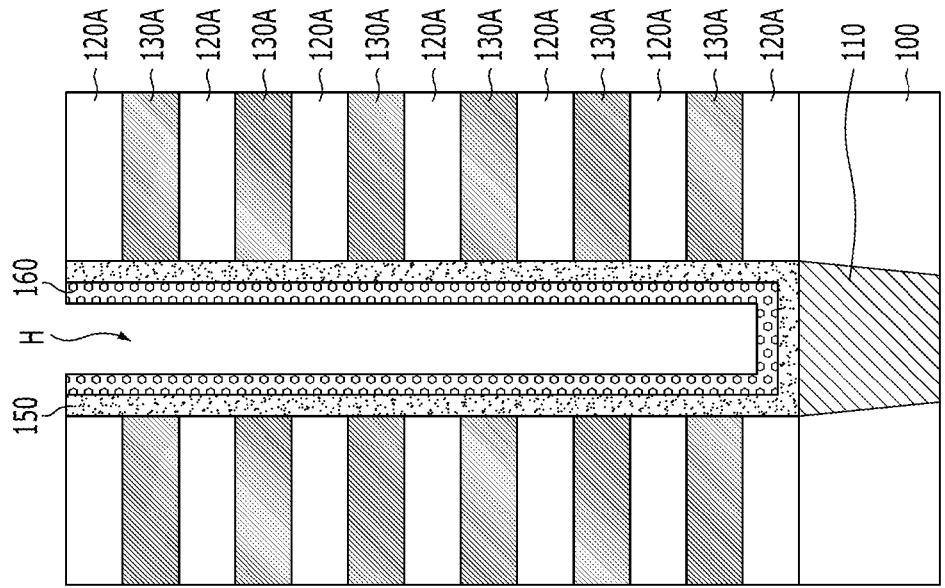

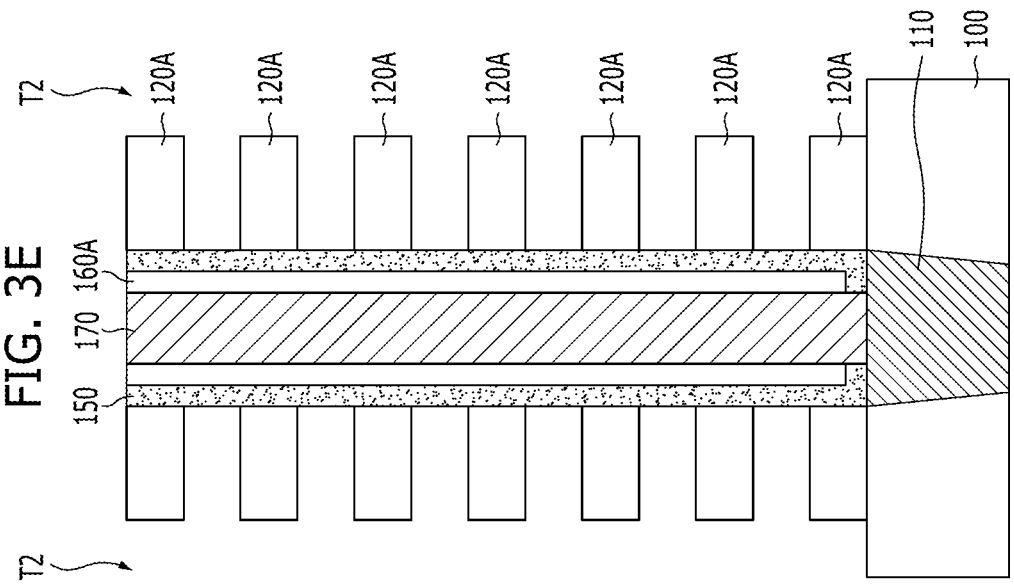
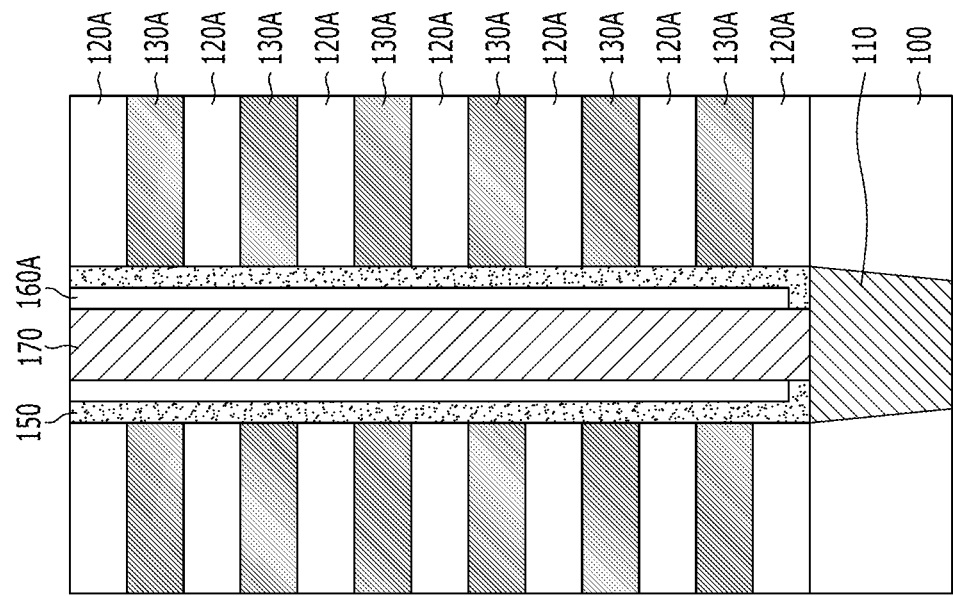

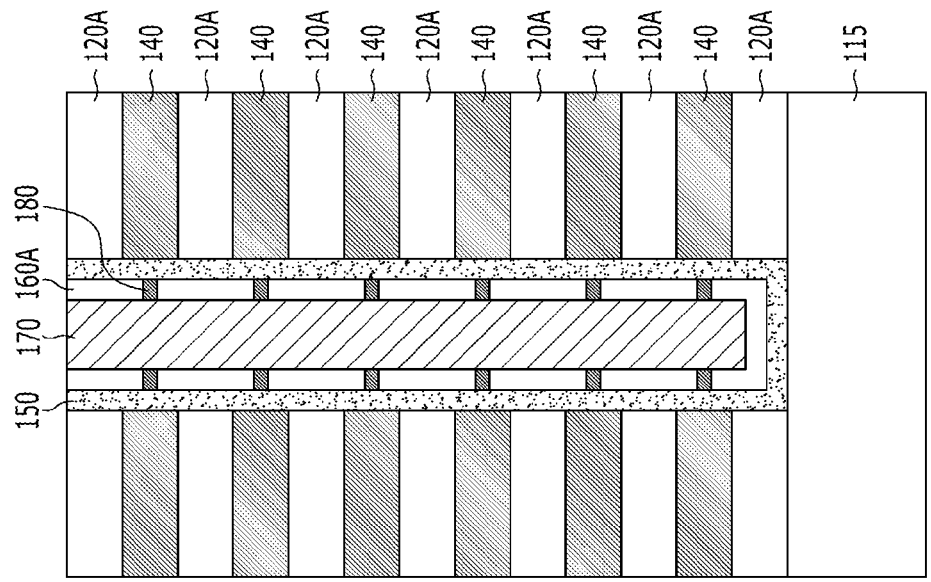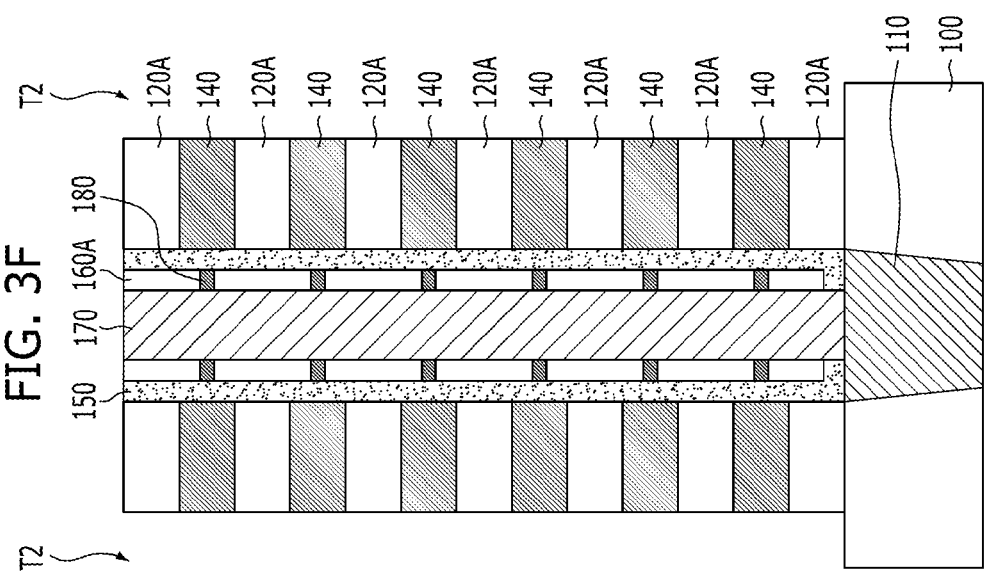

SEMICONDUCTOR DEVICE AND ELECTRONIC DEVICE INCLUDING THE SAME

CROSS-REFERENCE TO RELATED APPLICATIONS

The present application claims priority of Korean Patent Application No. 10-2013-0026045, filed on Mar. 12, 2013, which is incorporated herein by reference in its entirety.

BACKGROUND

1. Field

Exemplary embodiments relate to a semiconductor device and an electronic device including the same, and more particularly, to a semiconductor device including a variable resistance layer of which resistance is changed according to an applied voltage or current so as to switch between two or more different resistance states, and an electronic device including the same.

2. Description of the Related Art

A variable resistance memory device, of which the resistance is changed according to an external stimulus, switches between two or more different resistance states so as to store data, and includes a resistive random access memory (ReRAM), a phase change RAM (PCRAM), a spin transfer torque-RAM (STT-RAM) and the like. The variable resistance memory device may be formed with a simple structure and has a variety of excellent characteristics such as nonvolatility. Thus, extensive research has been conducted on the variable resistance memory device.

Among the variable resistance memory devices, ReRAM has a structure including (i) a variable resistance material, for example, a variable resistance layer formed of a perovskite-based material or transition metal oxide and (ii) electrodes over and under the variable resistance layer. Depending on a voltage level applied to the electrodes, a filament-shaped current path is formed or disappears within the variable resistance layer. Thus, when the filament-shaped current path is formed, the variable resistance layer is set to a low resistance state, and when the filament-shaped current path disappears, the variable resistance layer is set to a high resistance state. An operation of switching from a high resistance state to a low resistance state is referred to as a set operation, and an operation of switching from a low resistance state to a high resistance state is referred to as a reset operation.

SUMMARY

Various embodiments are directed to a semiconductor device which includes a metal-insulator transition layer having a threshold voltage switching characteristic, formed by reducing a transition metal oxide layer, thereby improving a switching characteristic, and an electronic device including the same.

In an embodiment, a semiconductor device includes: a vertical electrode provided over a substrate; a variable resistance layer provided at least a sidewall of the vertical electrode; a plurality of horizontal electrodes extending from the sidewall of the vertical electrode and having the variable resistance layer interposed; a transition metal oxide layer provided (i) between the vertical electrode and the variable resistance layer or (ii) between the plurality of horizontal electrodes and the variable resistance layer; and a threshold voltage switching layer provided in the transition metal oxide layer and selectively between the vertical electrode and the any of the plurality of horizontal electrodes.

In an embodiment, a semiconductor device includes: a first electrode; a second electrode spaced from the first electrode; a variable resistance layer and a transition metal oxide layer stacked between the first electrode and the second electrode; and a threshold voltage switching layer locally formed in the transition metal oxide layer between the first and the second electrodes.

In an embodiment, a electronic device includes: a variable memory device configured to store data and maintain the stored data regardless of power supply; and a memory controller configured to control input/output of the data stored in the variable resistance memory device according to a command inputted from outside, wherein the variable resistance memory device comprises: a vertical electrode provided over a substrate; a variable resistance layer provided at least a sidewall of the vertical electrode; a plurality of horizontal electrodes extending from the sidewall of the vertical electrode with having the variable resistance layer interposed; a transition metal oxide layer provided (i) between the vertical electrode and the variable resistance layer or (ii) between the plurality of horizontal electrodes and the variable resistance layer; and a threshold voltage switching layer provided in the transition metal oxide layer and between the vertical electrode and the any of the plurality of horizontal electrodes.

BRIEF DESCRIPTION OF THE DRAWINGS

FIGS. 1A to 1H are cross-sectional views for explaining a semiconductor device and a method for fabricating the same in accordance with a first embodiment.

FIGS. 2A to 2C are cross-sectional views for explaining a semiconductor device and a method for fabricating the same in accordance with a second embodiment.

FIGS. 3A to 3F are cross-sectional views for explaining a semiconductor device and a method for fabricating the same in accordance with a third embodiment.

FIG. 4 is a cross-sectional view for explaining a semiconductor device and a method for fabricating the same in accordance with a fourth embodiment.

DETAILED DESCRIPTION

Figure 1B:
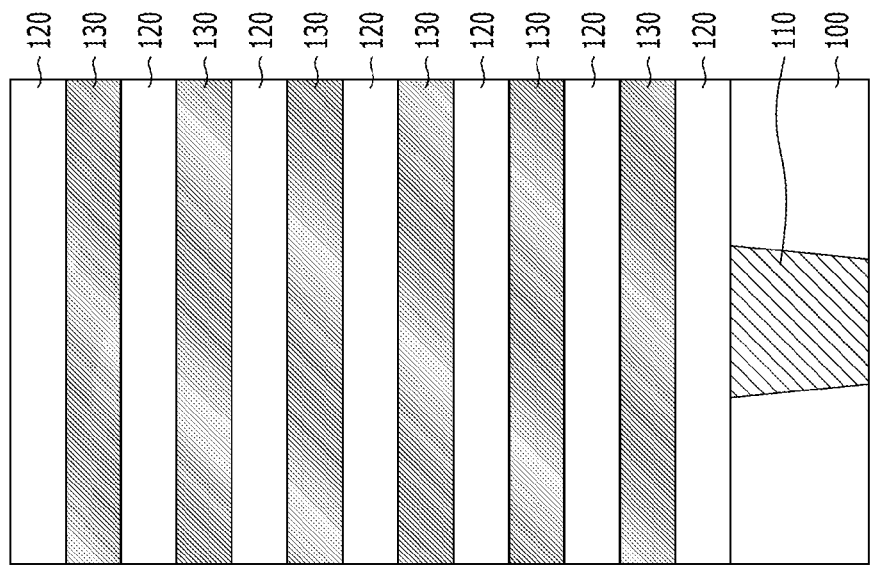

Various embodiments will be described below in more detail with reference to the accompanying drawings. The present invention may, however, be embodied in different forms and should not be construed as limited to the embodiments set forth herein. Rather, these embodiments are provided to help understanding of those skilled in the art. Throughout the disclosure, like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1H are cross-sectional views for explaining a semiconductor device and a method for fabricating the same in accordance with a first embodiment. In particular, FIG. 1H is a cross-sectional view of the semiconductor device in accordance with the first embodiment, and FIGS. 1A to 1G are cross-sectional views illustrating steps for fabricating the device of FIG. 1H.

Figure 1A:
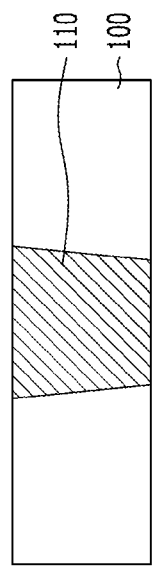

Referring to FIG. 1A, an insulation layer 100 is formed over a substrate (not illustrated) having a predetermined lower structure. The insulation layer 100 may include one or more of oxide-based materials, for example, silicon oxide ($SiO_2$), TEOS (Tetra Ethyl Ortho Silicate), BSG (Boron Silicate Glass), PSG (Phosphorus Silicate Glass), BPSG (Boron Phosphorus Silicate Glass), FSG (Fluorinated Silicate Glass), SOG (Spin On Glass) and the like. Although not illustrated in FIG. 1A, the substrate may include peripheral circuits for driving the semiconductor device.

The insulation layer 100 is selectively etched to form a trench, and a conductive layer 110 is formed in the trench. The conductive layer 110 may be formed through the following process: a conductive material, for example, a metal, a metal nitride, or doped polysilicon is deposited to such a thickness as to fill the trench and a planarization process such as chemical mechanical polishing (CMP) is performed until the top surface of the insulation layer 100 is exposed. The conductive layer 110 may have an island shape. When viewed from the top, a plurality of conductive layers 110 may be arranged in a matrix shape and used as contact plugs or contact pads. Furthermore, the conductive layer 110 may have a line shape. In this case, the conductive layer 110 may be used as an interconnection.

Referring to FIG. 1B, a plurality of interlayer dielectric layers 120 and sacrificial layers 130 are alternately stacked over the insulation layer 100 and the conductive layer 110. Hereafter, the structure in which the plurality of interlayer dielectric layers 120 and sacrificial layers 130 are alternately stacked is referred to as a stacked structure, for convenience of description.

The interlayer dielectric layer 120 may be disposed at the uppermost and lowermost portions of the stacked structure, and may be formed of an oxide-based material. The sacrificial layer 130 is removed in a subsequent process and replaced with a horizontal electrode as will be described below. The sacrificial layer 130 may be formed of a material having a different etch rate from the interlayer dielectric layer 120, for example, a nitride-based material. FIG. 1B illustrates six-fold sacrificial layers 130, but the number of sacrificial layers 130 may be set to be less or more than six.

Referring to FIG. 1C, the stacked structure is selectively etched to form a hole H to expose the conductive layer 110. As a result, the sacrificial layers 130 are exposed to the hole H. The sacrificial layers 130 exposed through the hole H are removed. When viewed from the top, a plurality of holes H may be arranged in a matrix shape. When viewed from the top, the hole H may have a square shape, a circular shape, a rectangular shape, or an elliptical shape. The sacrificial layer 130 may be removed through a wet etching process based on a dip-out method using a difference in wet etch rate from the interlayer dielectric layer 120. The interlayer dielectric layer 120 left even after this process is referred to as an interlayer dielectric layer pattern 120A. Although not illustrated, the sacrificial layer 130 may be partially left to support the interlayer dielectric layer pattern 120A.

Referring to FIG. 1D, a horizontal electrode 140 fills in the space created when the sacrificial layer 130 was removed. The horizontal electrode 140 may be formed of a conductive material, for example, (i) a metal nitride such as titanium nitride (TiN), tantalum nitride (TaN), titanium aluminum nitride (TiAlN), or tungsten nitride (WN), (ii) a metal such as tungsten (W), aluminum (Al), copper (Cu), gold (Au), silver (Ag), platinum (Pt), nickel (Ni), chrome (Cr), cobalt (Co), titanium (Ti), ruthenium (Ru), hafnium (Hf), or zirconium (Zr), and/or (iii) doped polysilicon. The horizontal electrode 140 may be formed through the following process.

First, a conductive material is conformally deposited through chemical vapor deposition (CVD) or atomic layer deposition (ALD) to form a conductive layer (not illustrated) for horizontal electrode to such a thickness as to fill the hole H and the space created when the sacrificial layer 130 was removed. The conductive layer filling the hole H is removed outside of the hole. That is, the conductive layer for horizontal electrode is etched until the side surfaces of the interlayer dielectric layer patterns 120A are exposed. As a result, the horizontal electrode 140 remains between the interlayer dielectric layer patterns 120A.

Referring to FIG. 1E, a variable resistance layer 150 and a transition metal oxide layer 160 are sequentially formed on inner walls of the hole H in a liner type. The inner walls include a sidewall (or a side surface) and a bottom of the hole H. The variable resistance layer 150 may be formed by depositing a material, of which electric resistance is changed by (i) migration of oxygen vacancies or ions and/or (ii) phase change, through CVD or ALD. The transition metal oxide layer 160 may be formed by depositing a material which may be converted into a threshold voltage switching layer to be described below, for example, one or more of niobium oxide ($Nb_2O_5$) and vanadium oxide ($V_2O_5$) through CVD or ALD.

The material of which electric resistance is changed by migration of oxygen vacancies or ions may include (i) a perovskite-based material such as STO ($SrTiO_3$), BTO ($BaTiO_3$), and PCMO ($Pr_{1-x}Ca_xMnO_3$), and/or (ii) a binary oxide including transition metal oxides (TMO) such as titanium oxide ($TiO_2$, $Ti_4O_7$), hafnium oxide ($HfO_2$), zirconium oxide ($ZrO_2$), aluminum oxide ($Al_2O_3$), tantalum oxide ($Ta_2O_5$), niobium oxide ($Nb_2O_5$), cobalt oxide ($Co_3O_4$), nickel oxide (NiO), tungsten oxide ($WO_3$), and lanthanum oxide ($La_2O_3$). The material of which electric resistance is changed by phase change may include a material of which the state is changed between a crystalline state and amorphous state by application of heat, for example, a chalcogenide-based material such as GST (GeSbTe) in which germanium, antimony, and tellurium are combined at a predetermined ratio.

Referring to FIG. 1F, plasma is used to reduce the transition metal oxide layer 160. Specifically, when the transition metal oxide layer 160 is subject to plasma at an hydrogen ($H_2$) or ammonia ($HN_3$) atmosphere, the transition metal oxide layer 160 may be reduced by hydrogen (H*) excited by plasma. At this time, the reduction process may be performed at a temperature of 500° C. or less so as to prevent the properties of the variable resistance layer 150 from being degraded. The transition metal oxide layer 160 with reduced oxygen content as a result of the plasma process is referred to as a reduced transition metal oxide layer 160A. The reduced transition metal oxide layer 160A may include one or more of niobium oxide ($NbO_x$, $2<x<2.5$) and vanadium oxide ($VO_x$, $2<x<2.5$).

Referring to FIG. 1G, the variable resistance layer 150 and the reduced transition metal oxide layer 160A, which are formed at the bottom surface of the hole H, are partially etched to expose the conductive layer 110. A vertical electrode 170 is formed in the hole H and coupled to the conductive layer 110. The vertical electrode 170 may be formed of a conductive material, for example, (i) a metal nitride such as TiN, TaN, TiAlN, or WN, (ii) a metal such as W, Al, Co, Au, Ag, Pt, Ni, Cr, Co, Ti, Ru, Hf, or Zr, and/or (iii) doped polysilicon.

Referring to FIG. 1H, a part of the reduced transition metal oxide layer 160A between the horizontal electrode 140 and the vertical electrode 170 is converted into a threshold voltage switching layer 180 through an electro-forming process. Specifically, when a predetermined forming voltage is applied between the horizontal electrode 140 and the vertical electrode 170, a filament-shaped current path (not illustrated) created by oxygen vacancies or ions may be formed in the variable resistance layer 150 positioned between the horizontal electrode 140 and the vertical electrode 170. A portion of the reduced transition metal oxide layer 160A, which is contacted with the current path, may be converted into oxide having a relatively stable state and having decreased oxygen content. Thus, a portion of the reduced transition metal oxide layer 160A is changed into the threshold voltage switching layer 180, for example formed of niobium oxide ($NbO_2$) or vanadium oxide ($VO_2$). The threshold voltage switching layer 180 may be locally formed in the reduced transition metal oxide layer 160A which is formed of niobium oxide ($NbOx$, $2<x<2.5$) or vanadium oxide ($VOx$, $2<x<2.5$).

The threshold voltage switching layer 180 may be switched on/off at a specific threshold voltage, and thus may be used as a selecting element to select a specific memory cell among a plurality of memory cells. The threshold voltage switching layer 180 may include a metal-insulator transition (MIT) element of which electric resistance rapidly changes between an insulator state and a metal state when it reaches at a specific critical temperature. Alternatively, the threshold voltage switching layer 180 may include an ovonic switching element capable of performing threshold voltage switching operation.

Through the above-described fabrication method, the semiconductor device of FIG. 1H in accordance with the first embodiment of the embodiments may be fabricated.

Referring to FIG. 1H, the semiconductor device in accordance with the first embodiment of the embodiments includes the insulation layer 100 and the conductive layer 110 over the substrate (not illustrated), the vertical electrode 170 extended over the conductive layer 110 in a substantially vertical direction with respect to the substrate, the variable resistance layer 150 surrounding sidewalls of the vertical electrode 170, the plurality of interlayer dielectric layer patterns 120A and horizontal electrodes 140 which are alternately stacked along the direction in which the vertical electrode 170 extends, the threshold voltage switching layer 180 interposed between the vertical electrode 170 and the variable resistance layer 150 disposed over the horizontal electrode 140, and the reduced transition metal oxide layer 160A interposed between the vertical electrode 170 and the variable resistance layer 150 disposed over the interlayer dielectric layer pattern 120A.

The variable resistance layer 150 may include a material of which electric resistance is changed by migration of oxygen vacancies or ions or phase change, and the reduced transition metal oxide layer 160A may include one or more of niobium oxide ($NbOx$, $2<x<2.5$) and vanadium oxide ($VOx$, $2<x<2.5$). The horizontal electrode 140 may be formed in a plate shape and extends in a continuous manner without being separated by a slit or the like. For example, as shown in FIG. 1H, the horizontal electrode 140 may continuously extend from the top where the uppermost interlayer dielectric layer pattern 120A is located to the bottom where the conductive layer 110 is located.

The threshold voltage switching layer 180 may include an MIT element or an ovonic switching element, and the MIT element may include one or more of $NbO_2$ and $VO_2$ of which electric resistance is rapidly changed between an insulator state and a metal state when it reaches at a specific critical temperature. The threshold voltage switching layer 180 may be interposed between the variable resistance layer 150 disposed over the horizontal electrode 140 and the vertical electrode 170. Since the threshold voltage switching layer 180 is isolated from a neighboring threshold voltage switching layer 180 by the reduced transition metal oxide layer 160A, an interlayer leakage current between the neighboring threshold voltage switching layers 180 is suppressed from occurring.

Figure 2A:
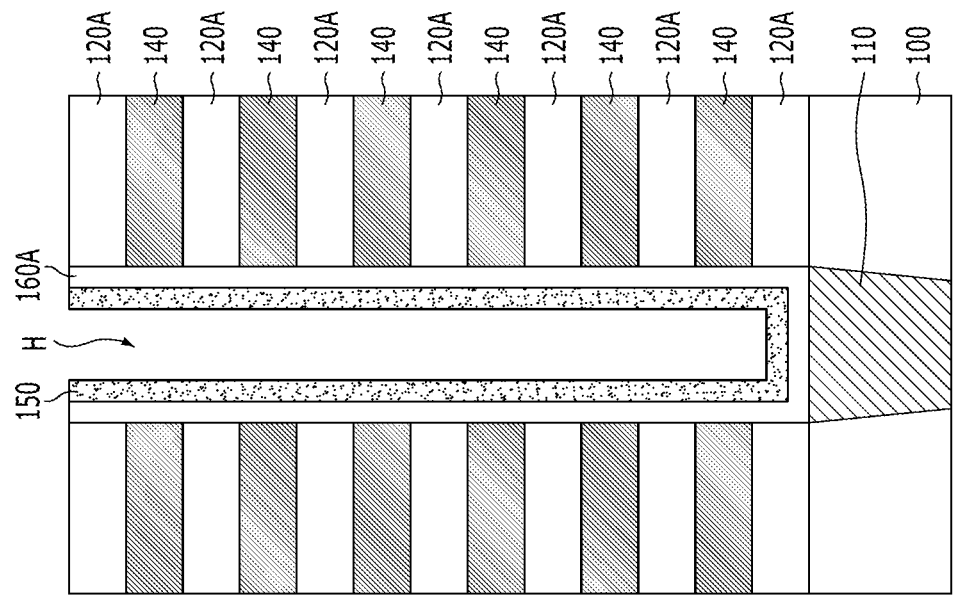
Figure 2B:
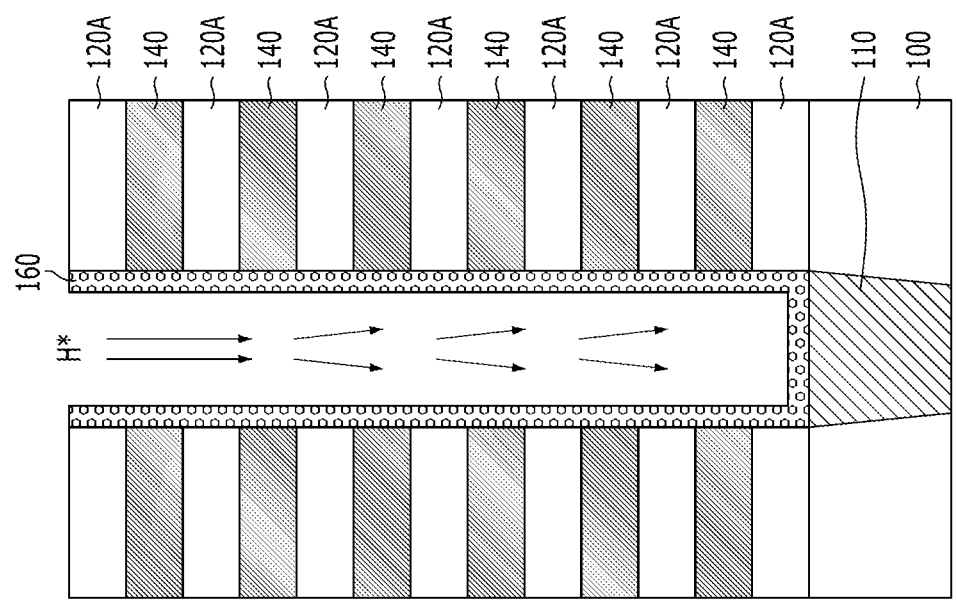

FIGS. 2A to 2C are cross-sectional views for explaining a semiconductor device and a method for fabricating the same in accordance with a second embodiment. In this embodiment, the detailed descriptions on substantially the same structures, configuration, or process steps as those of the first embodiment will be omitted. First, the processes of FIGS. 1A to 1D are performed in the same manner as the first embodiment, and then a process shown in FIG. 2A is then performed.

Referring to FIG. 2A, a transition metal oxide layer 160 is formed in the hole H in a liner type, and plasma is used to reduce the transition metal oxide layer 160. The transition metal oxide layer 160 may be formed by depositing a material such as $Nb_2O_5$ or $V_2O_5$, which may be converted into a threshold voltage switching layer to be described below, through CVD or ALD. When the transition metal oxide layer 160 is plasma-treated at an atmosphere of $H_2$ or $NH_3$, the transition metal oxide layer 160 may be reduced to the reduced transition metal oxide layer 160A by excited hydrogen (H*).

Referring to FIG. 2B, a variable resistance layer 150 is formed on the reduced transition metal oxide layer 160A. The reduced metal oxide layer 160A may include one or more of niobium oxide ($NbOx$, $2<x<2.5$) and vanadium oxide ($VOx$, $2<x<2.5$), and the variable resistance layer 150 may be formed by depositing a material, of which electric resistance is changed by migration of oxygen vacancies or ions or phase change, through CVD or ALD.

Referring to FIG. 2C, the variable resistance layer 150 and the reduced transition metal oxide layer 160A formed at the bottom surface of the hole H are partially etched to expose the conductive layer 110, and a conductive material such as metal nitride or doped polysilicon fills the hole H to form a vertical electrode 170. Then, a portion of the reduced transition metal oxide layer 160A between the horizontal electrode 140 and the vertical electrode 170 is converted into a threshold voltage switching layer 180 through an electro-forming process. The threshold voltage switching layer 180 may include $NbO_2$ and $VO_2$ of which electric resistance is rapidly changed as it transits between an insulator state and a metal state when it reaches at a specific critical temperature.

The second embodiment is different from the first embodiment in that the transition metal oxide layer 160 is formed before the variable resistance layer 150 and thus the threshold voltage switching layer 180 is interposed between the horizontal electrode 140 and the variable resistance layer 150.

FIGS. 3A to 3F are cross-sectional views for explaining a semiconductor device and a method for fabricating the same in accordance with a third embodiment. In this embodiment, the detailed descriptions which are substantially the same as those of the first embodiment will be omitted. First, the processes shown in FIGS. 1A and 1B are performed in the same manner as the first embodiment. Then, a process of FIG. 3A is performed.

Referring to FIG. 3A, a first slit T1 is formed by etching the stacked structure using a line-shaped mask pattern (not illustrated) extended in a predetermined direction as an etch mask, and then filled with an insulation layer 135. At this time, a plurality of first slits T1 may be arranged in parallel to each other when viewed from a cross section, and the etched interlayer dielectric layer 120 and the etched sacrificial layer 130 are referred to as an interlayer dielectric layer pattern 120A and a sacrificial layer pattern 130A, respectively. The insulation layer 135 may be formed of a material having a different wet etch rate from the sacrificial layer pattern 130A, for example, an oxide-based material.

Referring to FIG. 3B, the insulation layer 135 is further selectively etched to form a hole H which exposes side surfaces of the sacrificial layer patterns 130A and the top surface of the conductive layer 110. At this time, when viewed from the top, the plurality of holes H may be arranged in a matrix shape, and each of the hole H may have a square shape, a circular shape, a rectangular shape, or an elliptical shape.

Then, a variable resistance layer 150 and a transition metal oxide layer 160 are sequentially formed on inner walls of the hole H as a liner. The variable resistance layer 150 may include a material of which electric resistance is changed by migration of oxygen vacancies or ions or phase change, and the transition metal oxide layer 160 may include a material which may be converted into a threshold voltage switching layer as will be described below, for example, one or more of $Nb_2O_5$ and $V_2O_5$. The variable resistance layer 150 and the transition metal oxide layer 160 may be formed through CVD or ALD.

Referring to FIG. 3C, plasma is used to reduce the transition metal oxide layer 160. At this time, the reducing process may be performed under an atmosphere of $H_2$ or $NH_3$ at a temperature of 500° C. or less. As a result, oxygen content of the transition metal oxide layer 160 is decreased, resulting in a reduced transition metal oxide layer 160A. The reduced transition metal oxide layer 160A may include one or more of niobium oxide (NbOx, 2<x<2.5) and vanadium oxide (VOx, 2<x<2.5).

Referring to FIG. 3D, the variable resistance layer 150 and the reduced transition metal oxide layer 160A formed at the bottom surface of the hole H are partially etched to expose the conductive layer 110, and a vertical electrode 170 is formed in the hole H. The vertical electrode 170 may be formed of a conductive material, for example, metal nitride or doped polysilicon.

Referring to FIG. 3E, a second slit T2 is formed by etching the stacked structure at both sides of the hole using a line-shaped mask pattern (not illustrated) extended in the same direction as the first slit T1 as an etch mask. The sacrificial layer patterns 130A exposed through the second slit T2 are removed. At this time, when viewed from a cross section, a plurality of second slits T2 may be arranged in parallel to each other. The sacrificial layer pattern 130A may be removed through a wet etch process, e.g., a dip-out method, using a different wet etch rate from the interlayer dielectric layer pattern 120A.

Referring to FIG. 3F, a horizontal electrode 140 is formed in the space created by removing the sacrificial layer pattern 130A, and a portion of the reduced transition metal oxide layer 160A between the horizontal electrode 140 and the vertical electrode 170 is converted into a threshold voltage switching layer 180 through an electro-forming process. The electro-forming process may be performed by applying given voltages to the horizontal electrode 140 and the vertical electrode 170. The horizontal electrode 140 may be formed of a conductive material, for example, a metal, a metal nitride, and/or doped polysilicon, and the threshold voltage switching layer 180 may include $NbO_2$ and/or $VO_2$, whose electric resistance is rapidly changed between an insulator state and a metal state when it reaches a specific critical temperature.

The third embodiment is different from the first embodiment in that the first and second slits T1 and T2 are formed and thus the horizontal electrode 140 is formed in a line shape instead of a plate shape.

FIG. 4 is a cross-sectional view for explaining a semiconductor device and a method for fabricating the same in accordance with a fourth embodiment. In this embodiment, the detailed descriptions which are substantially the same as those of the first embodiment will be omitted.

Referring to FIG. 4, the semiconductor device in accordance with the fourth embodiment may include a vertical electrode 170 extended in a substantially vertical direction with respect to an upper surface of substrate 115, a variable resistance layer 150 surrounding the vertical electrode 170, a plurality of interlayer dielectric layer patterns 120A and horizontal electrodes 140 which are alternately stacked along a direction to which the vertical electrode 170 extends, a threshold voltage switching layer 180 interposed between the vertical electrode 170 and the variable resistance layer 150 disposed over the horizontal electrode 140, and a reduced transition metal oxide layer 160A interposed between the vertical electrode 170 and the variable resistance layer 150 disposed over the interlayer dielectric layer pattern 120A.

The substrate 115 may include a silicon (Si) substrate, a germanium (Ge) substrate, a silicon-germanium (SiGe) substrate, or a silicon-on-insulator (SOI) substrate, and the variable resistance layer 150 may include a material of which electric resistance is changed by migration of oxygen vacancies or ions or phase change. The reduced transition metal oxide 160A may include one or more of niobium oxide (NbOx, 2<x<2.5) and vanadium oxide (VOx, 2<x<2.5), and the threshold voltage switching layer 180 may include one or more of $NbO_2$ and $VO_2$ of which electric resistance is rapidly changeable when it reaches at a specific critical temperature.

In the fourth embodiment, a bottom of the vertical electrode 170 does not pass through the variable resistance layer 150 and the reduced transition metal oxide layer 160A, thereby preventing etch damage made to the variable resistance layer 150. In such a structure, since the variable resistance layer 150 and the reduced transition metal oxide layer 160A cover the bottom of the vertical electrode 170, an interconnection (not illustrated) disposed over and connected with the vertical electrode 170.

FIGS. 5A to 5D are cross-sectional views for explaining a semiconductor device and a method for fabricating the same in accordance with a fifth embodiment. In this embodiment, the detailed descriptions that are substantially the same as those of the first embodiment will be omitted.

Figure 5A:
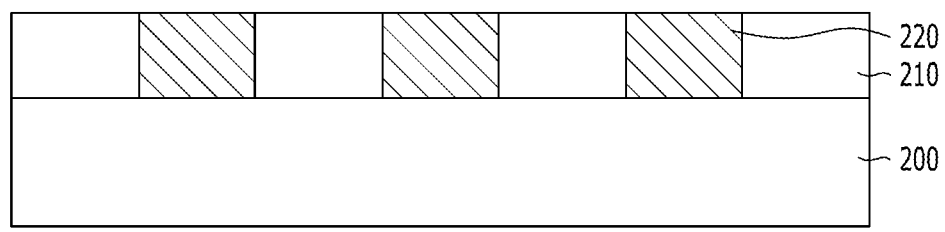
FIGS. 5A to 5D are cross-sectional views for explaining a semiconductor device and a method for fabricating the same in accordance with a fifth embodiment.

Referring to FIG. 5A, an interlayer dielectric layer 210 is formed over a substrate 200 having a predetermined lower structure. The substrate 200 may include a silicon (Si) substrate, a germanium (Ge) substrate, a silicon-germanium (SiGe) substrate, and/or a silicon-on-insulator (SOI) substrate, and the interlayer dielectric layer 210 may include an oxide-based material, for example, one or more of $SiO_2$, TEOS, BSG, PSG, BPSG, FSG, and SOG.

Then, the interlayer dielectric layer 210 is selectively etched to form a trench, and a first electrode 220 is formed in the trench. The first electrode 220 may be formed through the following process: a conductive material, for example, a metal, a metal nitride, and/or doped polysilicon is deposited to such a thickness to fill the trench, and a planarization process such as CMP is performed until the top surface of the interlayer dielectric layer 210 is exposed. At this time, a plurality of first electrodes 220 may be extended in parallel to each other along a predetermined direction.

Figure 5B:
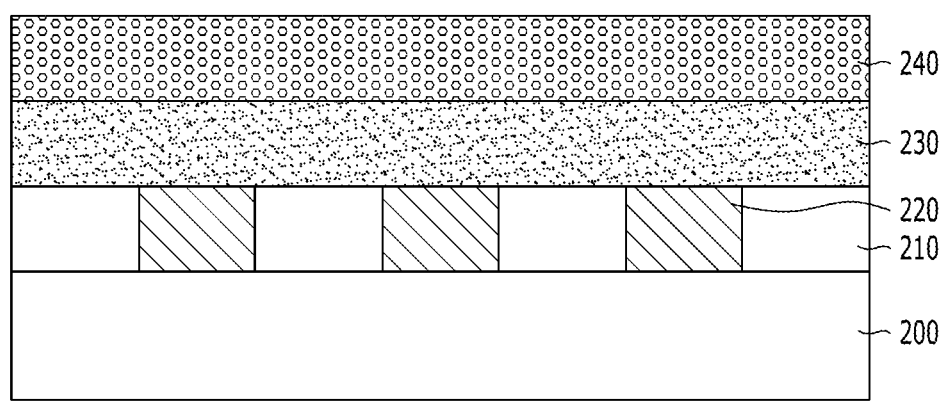

Referring to FIG. 5B, a variable resistance layer 230 and a transition metal oxide layer 240 are sequentially stacked over the interlayer dielectric layer 210 and the first electrode 220. The variable resistance layer 230 may include a material of which electric resistance is changed by migration of oxygen vacancies or ions or phase change, and the transition metal oxide layer 240 may include a material which may be converted into a threshold voltage switching layer as will be described below, for example, one or more of $Nb_2O_5$ and $V_2O_5$. The variable resistance layer 230 and the transition metal oxide layer 240 may be formed through CVD or ALD.

Figure 5C:
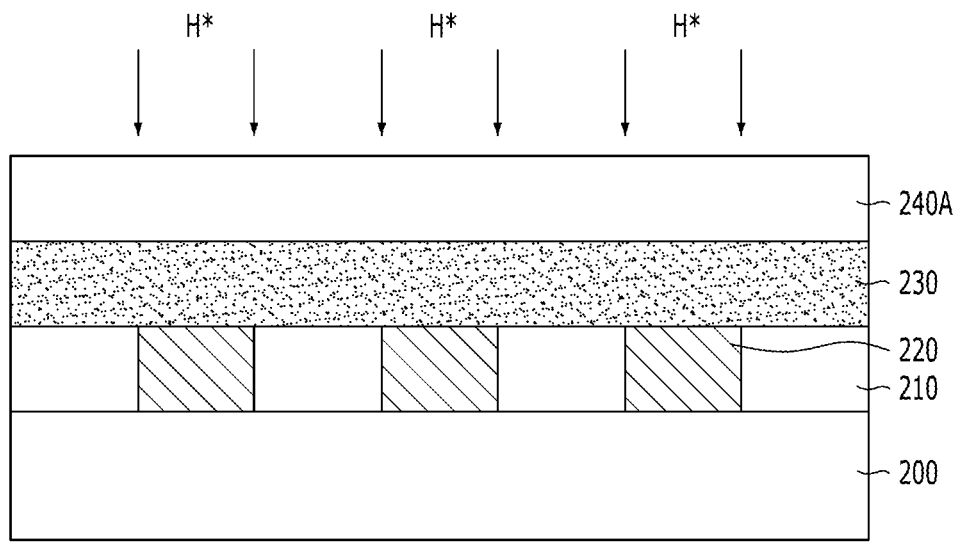

Referring to FIG. 5C, plasma is used to reduce the transition metal oxide layer 240. At this time, the reducing process may be performed under at atmosphere of $H_2$ or $NH_3$ at a temperature of 500° C. or less. As a result, oxygen content of the transition metal oxide layer 240 is decreased to form a reduced transition metal oxide layer 240A. The reduced transition metal oxide layer 240A may include one or more of niobium oxide ($NbO_x$, $2<x<2.5$) and vanadium oxide ($VO_x$, $2<x<2.5$).

Figure 5D:
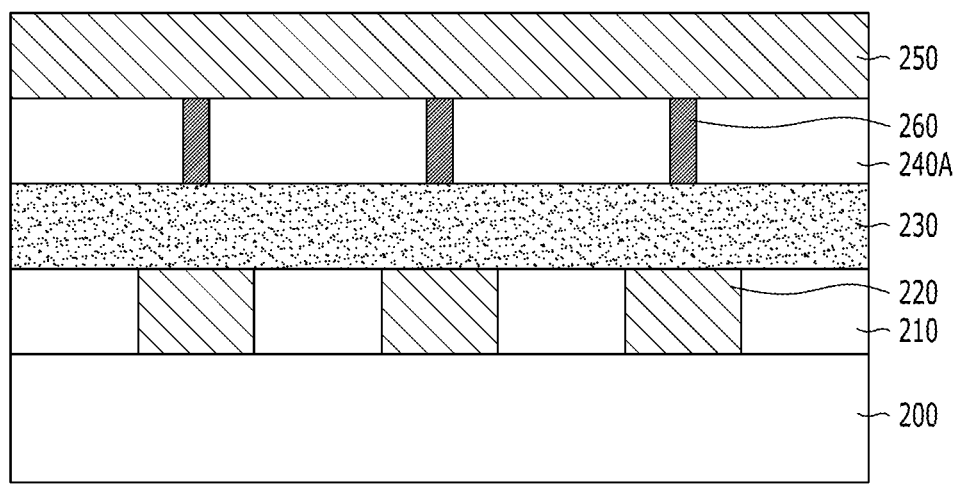

Referring to FIG. 5D, a second electrode 250 is formed over the reduced transition metal oxide layer 240A, and a portion of the reduced transition metal oxide layer 240A between (i) the variable resistance layer 230 over the first electrode 220 and (ii) the second electrode 250, is converted into a threshold voltage switching layer 260 through an electro-forming process. The second electrode 250 may be formed of a conductive material, for example, a metal, a metal nitride, and/or doped polysilicon. At this time, a plurality of second electrodes 250 may be extended in parallel to each other in a direction crossing the first electrode 220. The threshold voltage switching layer 260 may include $NbO_2$ and $VO_2$ of which electric resistance is rapidly changeable between an insulator state and a metal state when it reaches at a specific critical temperature.

Through the above-described fabrication method, the semiconductor device of FIG. 5D in accordance with the fifth embodiment may be fabricated.

Referring to FIG. 5D, the semiconductor device in accordance with the fifth embodiment may include the first electrode 220, the second electrode 250 spaced from the first electrode 220, the variable resistance layer 230 provided between the first and second electrodes 220 and 250, the reduced transition metal oxide layer 240A provided between the second electrode 250 and the variable resistance layer 230 over the interlayer dielectric layer 210, and the threshold voltage switching layer 260 locally formed in the reduced transition metal oxide layer 240A and provided between the second electrode 250 and the variable resistance layer 230 over the first electrode 220.

The first and second electrodes 220 and 250 may be extended in directions crossing each other, and the threshold voltage switching layer 260 may be formed at the intersections between the first and second electrodes 220 and 250. The threshold voltage switching layer 260 and the reduced transition metal oxide layer 240A may include the same materials such as niobium oxide and vanadium oxide, but with different composition ratios. The threshold voltage switching layer 260 may be formed in a manner of passing through the reduced transition metal oxide layer 240A.

Figure 6:
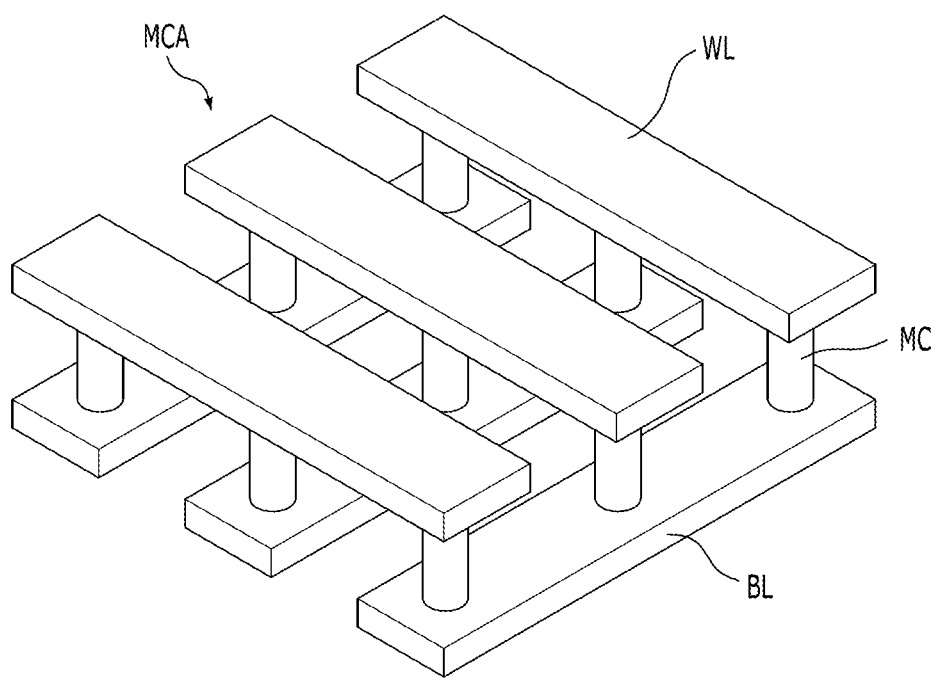
FIG. 6 is a perspective view of a memory cell array (MCA) of the semiconductor device in accordance with the embodiment.

FIG. 6 is a perspective view of a memory cell array (MCA) of the semiconductor device in accordance with an embodiment.

Referring to FIG. 6, the semiconductor device in accordance with the embodiment may form a cross-point cell array which includes a plurality of bit lines BL extended in parallel to each other in a predetermined direction, a plurality of word lines WL spaced from the bit lines BL and extended in parallel to each other in a direction crossing the bit lines BL, and a plurality of memory cells MC arranged at the respective intersections between the bit lines LB and the word lines WL.

Each of the memory cells MC may include a variable resistance layer of which resistance is changed according to an applied voltage or current so as to switch between two or more different resistance states and a threshold voltage switching layer of which electric resistance is rapidly changeable between an insulator state and a conducting state when it reaches at a specific critical temperature. In particular, the metal-insulator transition layer may function as a selecting element in the cross-point cell array, thereby effectively suppressing a sneak current flowing through an unselected memory cell MC.

Figure 7:
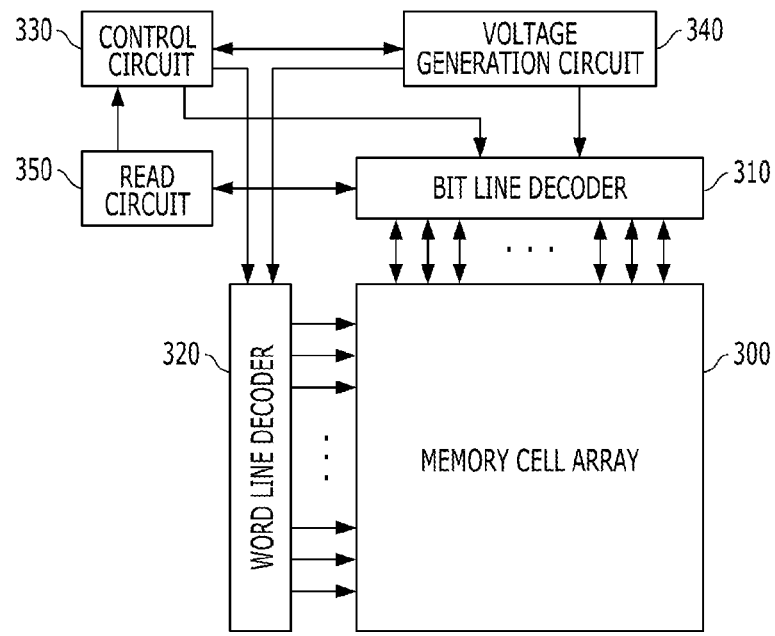
FIG. 7 is a diagram illustrating the configuration of a semiconductor device according to an embodiment.

FIG. 7 is a diagram illustrating the configuration of a semiconductor device according to an embodiment of the embodiments.

Referring to FIG. 7, a memory cell array 300 includes memory cells of a semiconductor device according to an embodiment. The memory cell array 300 may be arranged in a matrix form. A bit line decoder 310, a word line decoder 320, a control circuit 330, a voltage generation circuit 340, and a read circuit 350 may be arranged in the neighborhood of the memory cell array 300.

The bit line decoder 310 is connected to each bit line of the memory cell array 300 to select a bit line that corresponds to an address signal. In the same manner, the word line decoder 320 is connected to each word line of the memory cell array 300 to select a word line that corresponds to an address signal. That is, a specific memory cell of the memory cell array 300 may be selected by the bit line decoder 310 and the word line decoder 320.

The control circuit 330 controls the bit line decoder 310, the word line decoder, and the voltage generation circuit 340 based on the address signal, a control input signal, and input data during write operation, and particularly controls write, erase, and read operations of the memory cell array 300. Further, the control circuit 330 may control functions of a general address buffer circuit, a data input/output buffer circuit, and a control input buffer circuit.

The voltage generation circuit 340 generates voltages that are necessary during the write, erase, and read operations of the memory cell array 300, and supplies given voltages to the bit line and the word line. For example, the read circuit 350 reads out data stored in a selected memory cell by sensing a resistance state of the selected memory cell, and transfers the data to the control circuit 330.

Figure 8:
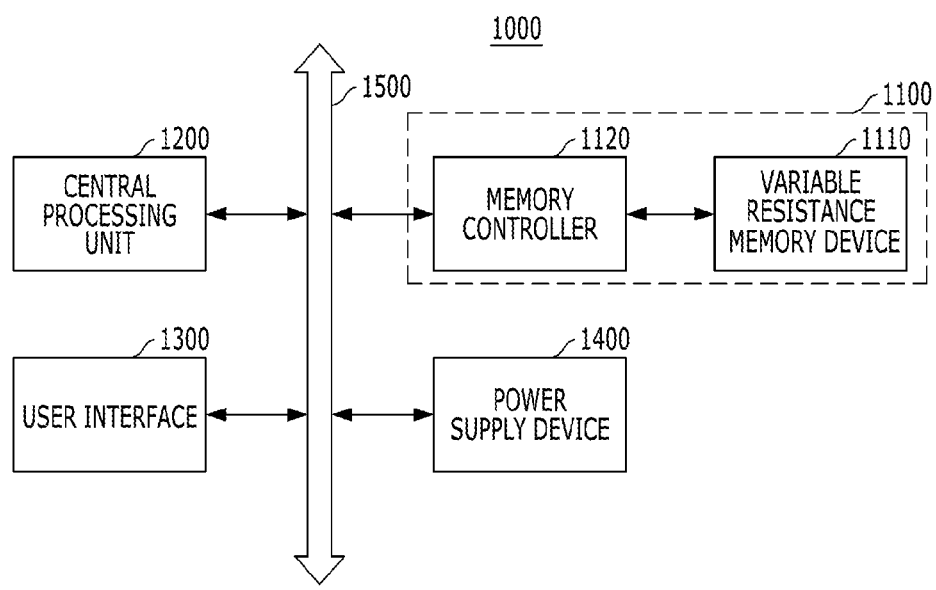
FIG. 8 is a diagram illustrating the configuration of an electronic device including a semiconductor device according to an embodiment.

FIG. 8 is a diagram illustrating the configuration of an electronic device including a semiconductor device according to an embodiment.

Referring to FIG. 8, an electronic device 1000 including a semiconductor device according to an embodiment may include a data storage system 1100, a central processing unit 1200, a user interface 1300, and a power supply device 1400 supplying power that is necessary for operations of the above-described constituent elements. The constituent elements can communicate with each other through a bus 1500. The electronic device 1000 is a device that can perform operations of input, processing, output, communication, and storage, etc. The electronic device 1000 may be a computer, a server, a tablet PC (Personal Computer), a portable computer, a PDA (Personal Digital Assistant), a wireless phone, a mobile phone, a smart phone, a digital music player, a PMP (Portable Multimedia Player), a camera, a GPS (Global Positioning System), a video camera, a voice recorder, telematics, an AV system (Audio Visual system), a smart TV (smart Television), or the like.

The data storage system 1100 may include a variable resistance memory device 1110 that can hold the stored data even when a power supply is not provided, and a memory controller 1120 controlling input/output of data stored in the variable resistance memory device 1110 in accordance with a command input from outside. The data storage system may be a HDD (Hard Disk Drive), a SSD (Solid State Drive), a USB (Universal Serial Bus) memory, a SD (Secure Digital) card, a mini SD (Secure Digital) card, a micro SD (Secure Digital) card, a SDHC (Secure Digital High Capacity) card, a memory stick, a CF (Compact Flash) card, a SM (Smart Media) card, a MMC (Multi-Media Card), an eMMC (Embedded MMC), or the like.

The variable resistance memory device 1110 may store data that is processed by the central processing unit 1200 or data that is input from outside through the user interface 1300, and may include one of the above-described semiconductor devices in accordance with the embodiments. For example, the variable resistance memory device 1110 may include a vertical electrode extending vertically from a substrate, a variable resistance layer surrounding side surfaces of the vertical electrode, a plurality of interlayer dielectric layers and horizontal electrodes which are alternately stacked along the vertical electrode, a threshold voltage switching layer interposed between the vertical electrode and the horizontal electrode, and a transition metal oxide layer interposed between the vertical electrode and the interlayer dielectric layer. On the other hand, the memory controller 1120 may control data exchange between the variable resistance memory device 1110 and the user interface 1300 in accordance with a command from the central processing unit 1200.

The central processing unit 1200 may perform analysis on a command input received from the user interface 1300, and operation and comparison of data stored in the data storage system 1100. The central processing unit 1200 may include a MPU (Micro Processor Unit), a single/multi core processor, an AP (Application Processor), a GPU (Graphic Processing Unit), a DSP (Digital Signal Processor), and the like.

The user interface 1300 may relay command exchange or data exchange between the electronic device 1000 and an external device, and may include a keypad, a keyboard, a mouse, a speaker, a microphone, various kinds of display devices, various kinds of HID (Human Interface Devices), or a communication device. The communication device may include a module that can operate in a wired or a wireless network.

Here, the module that can operate in a wired network may include a LAN (Local Area Network), a USB (Universal Serial Bus), an Ethernet, PLC (Power Line Communication), and the like. The module that can operate in a wireless network may include IrDA (Infrared Data Association), CDMA (Code Division Multiple Access), FDMA (Frequency Division Multiple Access), a wireless LAN, WiBro (Wireless Broadband Internet), USN (Ubiquitous Sensor Network), RFID (Radio Frequency Identification), NFC (Near Field Communication), Zigbee, Bluetooth, LTE (Long Term Evolution), HSDPA (High Speed Downlink Packet Access), WCDMA (Wideband CDMA), UWB (Ultra WideBand), or the like.

In accordance with the embodiments, the transition metal oxide layer may be reduced to form the metal-insulator transition layer having a threshold voltage switching characteristic, which makes it possible to improve switching characteristics such as nonlinearity of the variable resistance memory device.

Although various embodiments are described herewith for illustrative purposes, it will be apparent to those skilled in the art that various changes and modifications may be made without departing from the spirit and scope of the embodiments.

What is claimed is:

1. A semiconductor device comprising:
a vertical electrode disposed over a substrate;
a variable resistance layer disposed over a sidewall of the vertical electrode;
a plurality of horizontal electrodes stacked along the sidewall of the vertical electrode, the variable resistance layer being interposed between the vertical electrode and the plurality of horizontal electrodes;
a transition metal oxide layer disposed between the vertical electrode and the variable resistance layer or between the plurality of horizontal electrodes and the variable resistance layer; and
a threshold voltage switching layer including a plurality of portions, each of the portions disposed in the transition metal oxide layer and between the vertical electrode and a corresponding one of the plurality of horizontal electrodes,
wherein the threshold voltage switching layer and the transition metal oxide layer include substantially the same elements and have different composition ratios.

2. The semiconductor device of claim 1, wherein the threshold voltage switching layer comprises a metal-insulator transition element or an ovonic switching element.

3. The semiconductor device of claim 2, wherein the metal-insulator transition element is changeable between an insulator state and a metal state depending on temperature.

4. The semiconductor device of claim 1, wherein the threshold voltage switching layer comprises one or more of niobium oxide ($NbO_2$) and vanadium oxide ($VO_2$).

5. The semiconductor device of claim 1, wherein adjacent portions of the threshold voltage switching layer are isolated from each other by the transition metal oxide layer.

6. The semiconductor device of claim 1, wherein the threshold voltage switching layer is disposed between the variable resistance layer and the vertical electrode.

7. The semiconductor device of claim 1, wherein the threshold voltage switching layer is disposed between the horizontal electrodes and the variable resistance layer.

8. The semiconductor device of claim 1, wherein the transition metal oxide layer comprises one or more of niobium oxide ($NbO_x$, $2<x<2.5$) and vanadium oxide ($VO_x$, $2<x<2.5$).

9. The semiconductor device of claim 1, wherein the variable resistance layer comprises a material having an electric resistance changed by migration of oxygen vacancies or ions, or phase change.

10. The semiconductor device of claim 1, the device further comprising a conductive layer connected to a bottom of the vertical electrode.

11. The semiconductor device of claim 1, wherein the variable resistance layer is disposed under a bottom of the vertical electrode.

12. The semiconductor device of claim 1, wherein each of the plurality of horizontal electrodes has a plate shape or a line shape.

13. A semiconductor device comprising:
a first electrode;
a second electrode spaced from the first electrode;
a variable resistance layer and a transition metal oxide layer stacked between the first electrode and the second electrode; and
a threshold voltage switching layer locally disposed in the transition metal oxide layer between the first and the second electrodes, wherein the threshold voltage switching layer and the transition metal oxide layer include substantially the same elements and have different composition ratios.

14. The semiconductor device of claim 13, wherein the first and second electrodes extend in directions crossing each other.

15. The semiconductor device of claim 14, wherein the threshold voltage switching layer is disposed at an intersection between the first and second electrodes.

16. The semiconductor device of claim 13, wherein the elements comprise one or more of niobium and vanadium.

17. The semiconductor device of claim 13, wherein the threshold voltage switching layer passes through the transition metal oxide layer.

18. An electronic device comprising:
a variable memory device configured to store data and maintain the stored data regardless of power supply; and
a memory controller configured to control input/output of the data stored in the variable resistance memory device according to a command input from outside,
wherein the variable resistance memory device comprises:
a vertical electrode disposed over a substrate;
a variable resistance layer disposed over a sidewall of the vertical electrode;
a plurality of horizontal electrodes stacked along the sidewall of the vertical electrode, the variable resistance layer being interposed between the vertical electrode and the plurality of horizontal electrodes;
a transition metal oxide layer disposed between the vertical electrode and the variable resistance layer or between the plurality of horizontal electrodes and the variable resistance layer; and
a threshold voltage switching layer provided in the transition metal oxide layer and between the vertical electrode and the any of the plurality of horizontal electrodes,
wherein the threshold voltage switching layer and the transition metal oxide layer include substantially the same elements and have different composition ratios.

* * * * *